(12) United States Patent
Petroz

(10) Patent No.: US 7,048,799 B2
(45) Date of Patent: May 23, 2006

(54) DEVICE FOR PRODUCING ALLOY CRYSTALS BY COOLING AND CONTROLLED SOLIDIFICATION OF A LIQUID MATERIAL

(75) Inventor: Gérard Petroz, Montbonnot St Martin (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/482,268

(22) PCT Filed: Jun. 25, 2002

(86) PCT No.: PCT/FR02/02192

§ 371 (c)(1),
(2), (4) Date: Jun. 24, 2004

(87) PCT Pub. No.: WO03/000961

PCT Pub. Date: Jan. 3, 2003

(65) Prior Publication Data

US 2004/0244679 A1     Dec. 9, 2004

(30) Foreign Application Priority Data

Jun. 26, 2001 (FR) .................................. 01 08402

(51) Int. Cl.
*C30B 35/00* (2006.01)

(52) U.S. Cl. ...................... 117/223; 177/215; 177/216; 177/219

(58) Field of Classification Search ................ 117/215, 117/216, 219, 223
See application file for complete search history.

(56) References Cited

U.S. PATENT DOCUMENTS

| 4,264,406 A | * | 4/1981  | Hacskaylo    | 117/83  |
| 4,551,196 A | * | 11/1985 | Capper et al.| 117/83  |
| 4,980,133 A | * | 12/1990 | Koch         | 117/83  |
| 4,980,433 A | * | 12/1990 | Chen et al.  | 526/240 |

* cited by examiner

*Primary Examiner*—Felisa Hiteshew
(74) *Attorney, Agent, or Firm*—Thelen Reid & Priest LLP

(57) ABSTRACT

The device according to the present invention comprises a furnace (10) provided with heating means allowing said material to be crystallised to be rendered liquid, then to be cooled until it progressively solidifies. The device also comprises reception means (20) of the material (21) disposed in the furnace, fixed relative to the furnace and situated such that the material is in the intermediary zone. The heating means (11, 12, 13) supply three heating zones: a hot zone (16), an intermediary zone (15) and a cold zone (14). Thermally conductive means (17) are disposed between the reception means (20) and the heating means (11, 12, 13) and extend from the cold zone as far as the hot zone.

7 Claims, 2 Drawing Sheets

DEVICE FOR PRODUCING ALLOY CRYSTALS BY COOLING AND CONTROLLED SOLIDIFICATION OF A LIQUID MATERIAL

This application claims priority based on International Patent Application No. PCT/FR02/02192 Jun. 25, 2002, entitled "Device For Producing Alloy Crystals By Cooling And Controlled Solidification Of A Liquid Material" by Gerard Petroz, which claims priority of French application no. 01/08402, filed on Jun. 26, 2001, and which was not published in English.

TECHNICAL FIELD

The present invention relates to a device for producing alloy crystals by cooling and controlled solidification of a liquid material.

It relates in particular to the production of crystals of semiconductors (binary, ternary, etc.) composed of families III-V or II-VI, or the homogeneity of composition associated with the crystalline quality results in the specifications and performance of the intended application. By way of example CdZnTe utilised as a substrate in infrared detection or as material for detecting ionising rays (X, γ rays, etc) may be cited by way of example.

In these two applications, the homogeneity of the chemical composition, and in particular the percentage of Zn, is capital because, in one case, it adapts the mesh parameter to that of an active thin layer deposited by epitaxy and, in another case, it participates directly in the detection.

PRIOR ART

It is well known that during solidification of an alloy, the concentration of these constituents (or of the impurities therein) varies along the ingot. This concentration in general follows the following equation called Pfann equation:

$$C = C_0 k (1-f)^{k-1}$$

f being the fraction of the solidified ingot,
C being the concentration of f,
$C_0$ being the concentration of f=0,
k being the segregation coefficient.

In the case of the alloy CdZnTe, the coefficient k for the element Zn is worth 1.3, signifying that the percentage of Zn varies from single to double along the ingot. This is what is shown in the diagram of FIG. 1.

In this diagram, the axis of the ordinates represents the concentration C of Zn in the alloy and the abscissa axis represents the fraction f of the solidified ingot. The curve I shows the evolution of the concentration of Zn according to the Pfann equation.

In the case of certain impurities in low concentration adapted thermal treatment enables, by diffusion, the rate of impurities in an alloy or a material to be homogenised. However, this method cannot be applied for the constituents of alloys whose rates can reach 25%.

Another known solution for endeavouring to eliminate this problem in certain cases comprises adding to the alloy an element whose segregation coefficient is opposite that of the element whose rate is to be stabilised. For example, in the case of CdZnTe, it is possible to add the element Se whose segregation coefficient is 0.9. This effectively allows the value of the mesh parameter on the ingot to be homogenised, but the presence of this element has harmful consequences on an active layer deposited by epitaxy.

The article <<Growth and characterization of 100 mm diameter CdZnTe single crystals by the vertical gradient freezing method >> by T. ASAHI et al., published in Journal of Crystal Growth 161 (1996), pages 20–27, divulges a process for growing a crystal of CdZnTe in a furnace comprising several heating zones, whereof the temperatures are controlled independently. The material to be crystallised is in a quartz ampoule which remains fixed at the centre of the furnace. However, this growth process does not provide homogeneous and monocrystalline ingots.

Therefore the problem arises of reducing the segregation of certain constituents of an alloy in order to improve the homogeneity of composition in the case of slow and controlled solidification and to guarantee a crystallographic quality or specific homogeneous properties.

U.S. Pat. No. 4,980,133 discloses a device for manufacturing crystals under controlled growth. The device comprises two heating tubes arranged in alignment and separated by a conductive sleeve. The heating tubes impose two different temperature zones, whereas the conductive sleeve ensures a thermal gradient zone between the heating tubes. Growth of the crystal occurs in an ampoule comprising the material to be crystallised. Crystallisation occurs when the ampoule is lowered from the upper warmer zone towards the lower cooler zone.

U.S. Pat. No. 4,264,406 discloses a crystalline growth process. The process comprises steps comprising:

arranging a crucible containing the material to be crystallised in the vicinity of the heating wall of a furnace, with the crucible remaining fixed relative to the heating wall during the heating and cooling phases, maintaining the temperature of the heating wall above the melting point of the material, progressively introducing a screen in between the crucible and the heating wall, where the screen enables the crystal to cool.

SUMMARY OF THE INVENTION

Since the quality of the ingot is directly associated with the temperature gradient to which the liquid material to be solidified is subjected, the crystallisation point must advance very regularly while the crystal grows. To this end, it is proposed according to the present invention to place a tube made of a thermally highly conductive material around the liquid material.

The device according to the present invention has the advantage of imposing no displacement on the ampoule or the crucible containing the material, or even the furnace. It is thus associated with a simple and very flexible process in its applications, especially the form of the gradient.

The object of the invention is thus a device for producing alloy crystals by cooling and controlled solidification of a liquid material comprising the constituents of the alloy, comprising a furnace provided with heating means enabling said material to be rendered liquid, then cooling it until it progressively solidifies, the device also comprising reception means of said material disposed in the furnace, characterised in that:

the heating means supply three juxtaposed heating zones: a so-called hot zone, a so-called intermediary zone with temperature gradient and a so-called cold zone, with the intermediary zone being located between the cold zone and the hot zone, the reception means are fixed relative to the furnace and are located so that the material is in the intermediary zone, thermally conductive means are disposed between the reception means and the heating means and extend from the cold zone as far as the hot zone.

Advantageously, the heating means are electric heating means.

According to a preferred embodiment, the furnace is a vertical furnace, with said three heating zones being superposed. The hot zone can be situated above the intermediary zone, with the cold zone then being located below the intermediary zone.

If the furnace and the reception means are cylindrical in shape, the thermally conductive means can be constituted by a tube. Advantageously, this tube is a tube having a constant thickness.

Preferably, the thermally conductive means are made of a metal selected from among copper, aluminium and special steels.

BRIEF DESCRIPTION OF THE DRAWINGS

The invention will be better understood and other advantages and features will emerge from reading the following description, given by way of non-limiting example, accompanied by the attached diagrams, in which.

DETAILED DESCRIPTION OF EMBODIMENTS OF THE INVENTION

Figure 2:
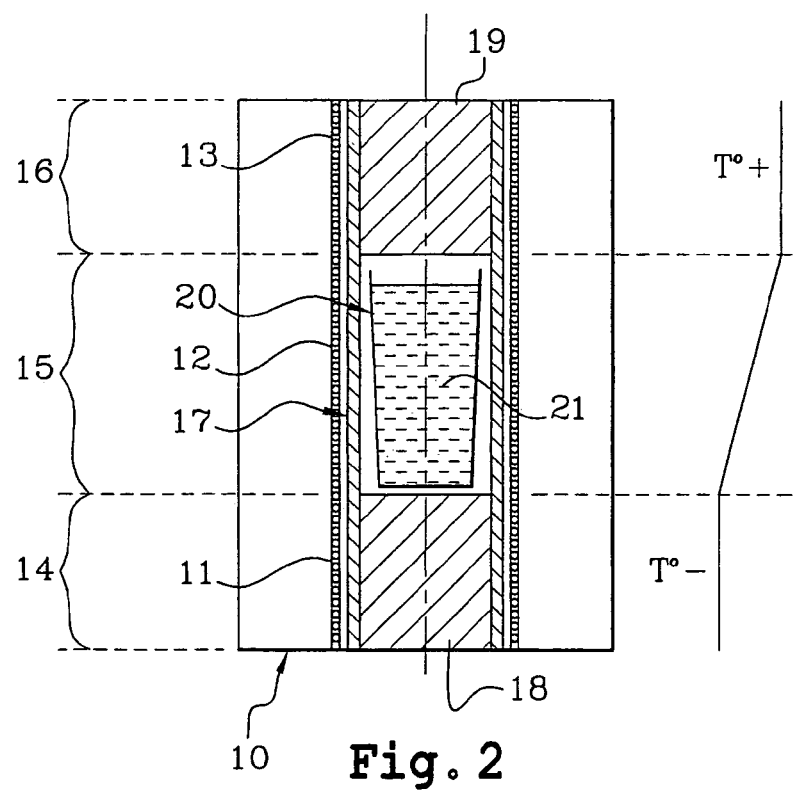
FIG. 2 shows, schematically and in longitudinal section, a device for producing alloy crystals according to the present invention.

FIG. 2 illustrates, in longitudinal section, a device for producing alloy crystals according to the present invention. This device has a general cylindrical shape.

The device comprises a vertical furnace 10 in the form of a hollow cylinder. The central hole of the furnace allows a crucible 20 to be introduced, comprising the material 21 to be crystallised.

The furnace 10 comprises three electric heating elements: the coil 11 located in the lower part, the coil 12 located in the middle part and the coil 13 located in the upper part. The coils 11, 12 and 13 define respectively a cold zone 14, an intermediary zone 15 (with temperature gradient) and a hot zone 16.

A tube 17, thermally highly conductive, is disposed in the central hole of the furnace. According to the specificities of the material to be crystallised, the tube can be made of copper, aluminium, or special steel. As shown in FIG. 2, the diameter of the crucible 20 is very close to the internal diameter of the tube 17.

In this embodiment, the tube 17 passes through the three heating zones. Its thickness must be sufficient for the transport of calories from the hot zone to the cold zone to take place expediently.

It is noted that the intermediary zone 15 has a height at least equal to the height of liquid material provided in the crucible 20.

The crucible 20 is confined to the centre of the furnace and remains fixed during the slow solidification operation which takes place from bottom to top in this working example, at a speed of between 0.1 and 5 mm/h for an alloy of CdZnTe type.

Plugs 18 and 19 occlude the two extremities of the central hole of the furnace. They are positioned in the parts of the central hole corresponding to the cold and hot zones.

The controlled solidification of the material is obtained by creating a continuous thermal gradient in the intermediary zone 15. Its average value depends on the difference in temperature between the upper 16 and lower 14 zones of the furnace and the power provided in the intermediary zone 15.

Figure 3:
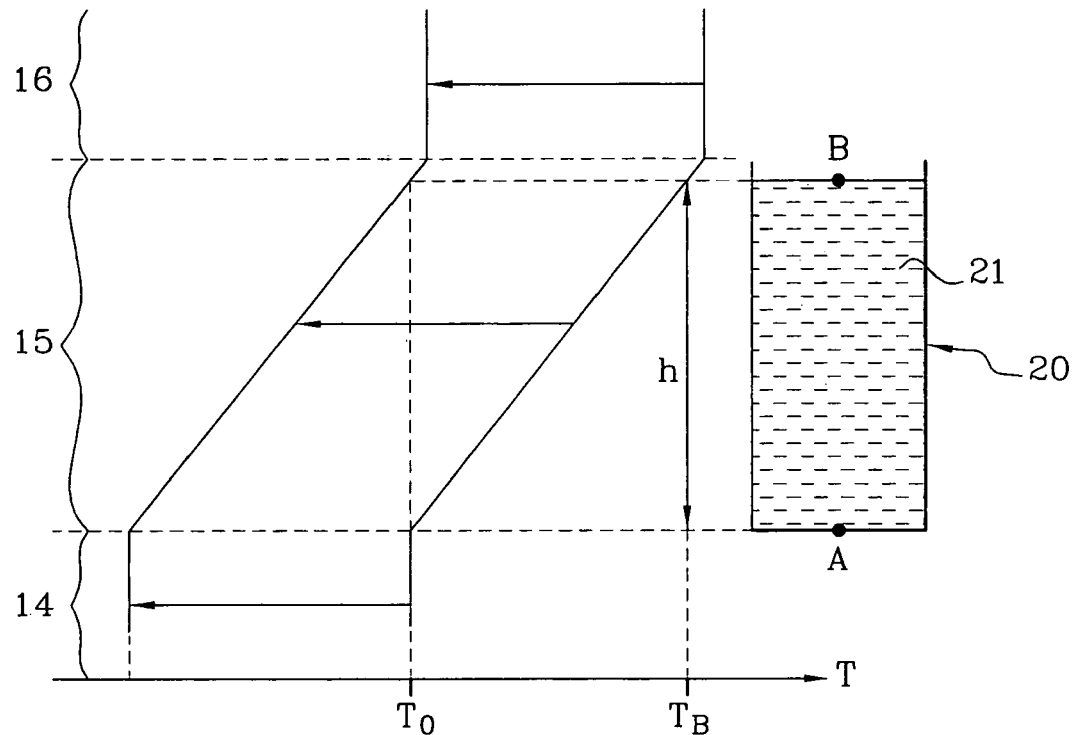
FIG. 3 is a graph illustrating the evolution of temperatures on the material to be solidified, at the beginning and at the end of solidification.

Displacement of the thermal gradient is obtained by suitably cooling the three zones, the solid-liquid limit being at the theoretic temperature of solidification of the alloy. FIG. 3 illustrates the principle of controlled solidification employed by the invention.

FIG. 3 shows, in the right section of the figure, the crucible 20 containing the material to be crystallised 21. Placed in the left section of the figure and corresponding to the crucible illustrated in the right section is a graph illustrating the evolution of temperatures on the material to be crystallised, at the beginning and at the end of solidification.

In this working example of the process according to the present invention, solidification takes place from bottom to top, but this solidification can also be carried out from top to bottom, or non-vertically.

At the commencement of solidification, point A (on the lower surface of the material) is at the temperature To which is the real solidification temperature of the material. At point B, located on the surface of the liquid, the temperature is higher and is TB. The thermal gradient between the points A and B is (TB−T0)/h, h being the height of the material in the crucible. The temperatures are reported on the temperature axis T.

The progressive solidification of the liquid material is obtained by cooling the three zones 14, 15 and 16. The ensemble of the thermal gradient moves during the operation towards lower temperatures as indicated by the arrows, such that when the temperature at point B reaches the value To, solidification is complete.

The invention produces and controls highly continuous and precise thermal gradients in the range (for example from 0 to 5° C./cm by 25 cm in length) on all the liquid in particular, and thus a controlled action on the convection regime of the liquid, the principal character in the segregation of the constituents from the material.

Figure 1:
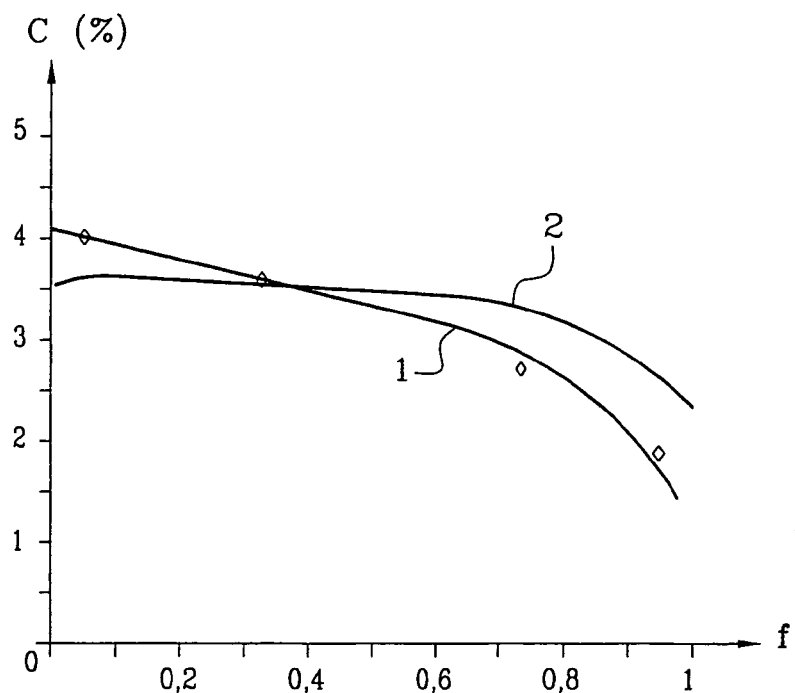
FIG. 1 is a diagram illustrating the evolution of the concentration of Zn in a CdZnTe alloy according to the Law of Pfann for an ingot according to the prior art and for an ingot according to the present invention.

The curve 2 of FIG. 1 shows, for a CdZnTe alloy, the evolution of the concentration of Zn by using the device according to the present invention. It is evident, by comparison with the curve 1, that better homogeneity is obtained over 80% of the ingot. The beginning and the end of the ingot are spaced apart, because they comprise specific defects.

Figures 4A, 4B, 4C:
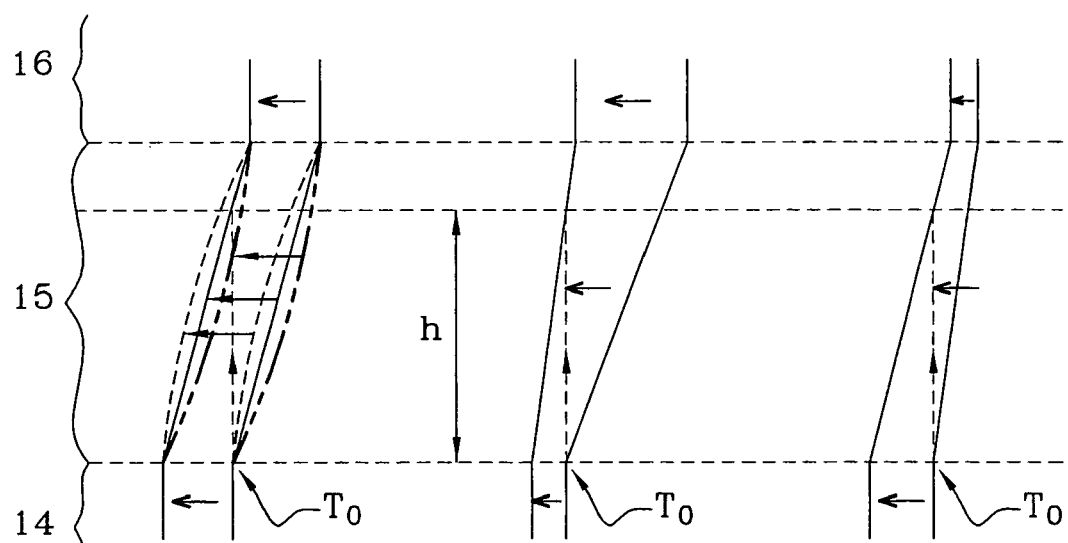
FIGS. 4A to 4C are graphs illustrating cooling programs modifying or not the speed of solidification and the thermal gradient during the course of solidification.

FIGS. 4A to 4C are graphs illustrating cooling programs allowing the solidification speed and the thermal gradient to be modified or not during solidification. The height h of material to be crystallised has been noted in these figures.

FIG. 4A shows programs at constant solidification speed. The graph in full lines corresponds to a constant thermal gradient. It is similar to that in FIG. 3. The graph in dot-and-dash lines corresponds to a decreasing thermal gradient. The graph in interrupted lines corresponds to an increasing thermal gradient.

FIG. 4B shows a graph corresponding to a program of increasing solidification speed and a decreasing thermal gradient.

FIG. 4C shows a graph corresponding to a program of decreasing solidification speed and an increasing thermal gradient.

It is well known in crystallogenesis that the least variation in temperature can have direct and harmful consequences on the quality of the ingots produced, since said temperature has a direct effect on the solidification speed which, if not continuous, generates defects and variations in segregation of the types. The device according to the present invention eliminates these risks for the following reasons:

the crucible containing the material is fixed and very confined in the furnace, the consequence of which is the absence of vibrations and no stack effect for the ambient gases;

the thermally conductive means passing through the furnace best homogenise the thermal power generated by the heating means of the furnace, both radially and longitudinally;

the mass of these thermally conductive means can absorb minor variations in temperature without major consequence on the growth of the solid;

the geometry of these thermally conductive means (cylindrical tube having a constant thickness, for example) aids in producing a linear thermal gradient, or on the other hand non-linear, but highly continuous. (If preferred, this flexibility can effectively vary the solidification speed along the ingot continuously and thus act on the segregation of the types).

The device according to the present invention is very simple and economically significant. It enables materials of high crystalline quality to be produced (minimum dislocation rate, perfection of the crystalline network, minimised effects of the segregation of the types).

In the event of a leak from the crucible or a reaction of the types, the thermally conductive means (for example a tube) protect the heating elements of the furnace.

The device according to the present invention in particular enables the production of crystals of CdZnTe intended for optronics. The homogeneity of the rate of Zn is improved by a factor of 1.5 on an ingot of 90 mm in diameter and 100 mm long. The crystalline quality of the resulting material is very suitable for the intended application.

The invention claimed is:

1. A device for producing alloy crystals by cooling and controlling the solidification of a liquid material comprising the constituents of the alloy, comprising a furnace provided with heating means allowing said material to be rendered a liquid then to be cooled until it progressively solidifies, said device also comprising reception means of said material disposed in the furnace, wherein:

the heating means provide three juxtaposed heating zones: a first zone, a second zone or intermediary zone with temperature gradient and a third zone, said intermediary zone being comprised between the first zone and the third zone, the temperature of the first zone being higher than the temperature of the third zone, the reception means are fixed relative to the furnace and are situated such that the material is in the intermediary zone, thermally conductive means are disposed between the reception means and the heating means and extend from the third zone as far as the first zone.

2. The device as claimed in claim 1, wherein the heating means are electric heating means.

3. The device as claimed in claim 1, wherein since the furnace is a furnace vertical, the three heating zones are superposed.

4. The device as claimed in claim 3, wherein the first zone is located above the intermediary zone, said third zone being located below the intermediary zone.

5. The device as claimed in claim 1, wherein since the furnace and a reception means are cylindrical in shape, the thermally conductive means are constituted by a tube.

6. The device as claimed in claim 5, wherein the tube is a tube of constant thickness.

7. The device as claimed in the claim 1, wherein the thermally conductive means are made of a metal selected from among copper, aluminium and special steels.

* * * * *